US009009861B2

(12) United States Patent
Park et al.

(10) Patent No.: US 9,009,861 B2
(45) Date of Patent: Apr. 14, 2015

(54) SUBSTRATE MEASUREMENT APPARATUS WITH ELECTRON DISTORTION UNIT

(75) Inventors: Byong Chon Park, Daejeon (KR); Ju Youb Lee, Seoul (KR); Woon Song, Seoul (KR); Jin Ho Choi, Daejeon (KR); Sang Jung Ahn, Daejeon (KR); Joon Lyou, Seoul (KR); Won Young Song, Incheon (KR); Jae Wan Hong, Seoul (KR); Seung Hun Baek, Seoul (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 14/128,290

(22) PCT Filed: Jun. 24, 2011

(86) PCT No.: PCT/KR2011/004639
§ 371 (c)(1),
(2), (4) Date: Dec. 20, 2013

(87) PCT Pub. No.: WO2012/176948
PCT Pub. Date: Dec. 27, 2012

(65) Prior Publication Data
US 2014/0130212 A1 May 8, 2014

(51) Int. Cl.
*G01Q 30/02* (2010.01)
*B82Y 35/00* (2011.01)
*H01J 37/28* (2006.01)

(52) U.S. Cl.
CPC .............. *G01Q 30/02* (2013.01); *B82Y 35/00* (2013.01); *H01J 37/28* (2013.01)

(58) Field of Classification Search
USPC ......... 250/305, 306, 310, 307, 311, 251, 302, 250/392, 397, 492.2; 850/18, 1, 20, 26, 33, 850/46, 47, 9
See application file for complete search history.

(56) References Cited

U.S. PATENT DOCUMENTS

| | | | | | |
|---|---|---|---|---|---|
| 4,962,306 | A | * | 10/1990 | Hodgson et al. | 250/310 |
| 6,124,142 | A | * | 9/2000 | Fujino et al. | 438/18 |
| 6,627,884 | B2 | * | 9/2003 | McCord et al. | 850/18 |
| 6,664,546 | B1 | * | 12/2003 | McCord et al. | 250/397 |
| 7,355,951 | B2 | * | 4/2008 | Yoo et al. | 369/101 |
| 8,153,338 | B2 | * | 4/2012 | Park et al. | 430/5 |

(Continued)

FOREIGN PATENT DOCUMENTS

JP 2005-172767 A 6/2005
KR 10-2006-0073279 A 6/2008

(Continued)

OTHER PUBLICATIONS

International Search Report for PCT/KR2011/004639 filed Jun. 24, 2011. (Park et al.).

*Primary Examiner* — David A Vanore
(74) *Attorney, Agent, or Firm* — Lee & Morse, P.C.

(57) ABSTRACT

Provided is a fusion measurement apparatus which increases or maximizes the reliability of a measurement. The fusion measurement apparatus includes an atomic microscope for measuring a surface of a substrate at an atomic level, an electron microscope for measuring the atomic microscope and the substrate, and at least one electrode which distorts the path of a secondary electron on the substrate covered by a cantilever of the atomic microscope so that the secondary electron proceeds to an electron detector of the electron microscope.

10 Claims, 12 Drawing Sheets

(56) References Cited

U.S. PATENT DOCUMENTS

| | | | |
|---|---|---|---|
| 8,359,661 B2 * | 1/2013 | Tachizaki et al. | 850/47 |
| 8,618,479 B2 * | 12/2013 | Kashihara | 250/311 |
| 8,674,301 B2 * | 3/2014 | Takagi | 250/307 |
| 2003/0058749 A1 * | 3/2003 | Yoo et al. | 369/13.01 |
| 2012/0001069 A1 * | 1/2012 | Kashihara | 250/310 |
| 2013/0081882 A1 * | 4/2013 | Lin et al. | 175/428 |
| 2014/0130212 A1 * | 5/2014 | Park et al. | 850/9 |

FOREIGN PATENT DOCUMENTS

| | | |
|---|---|---|
| KR | 10-0873154 B1 | 12/2008 |
| KR | 10-2009-0026933 A | 3/2009 |
| WO | WO 2009/096728 A2 | 8/2009 |

* cited by examiner

SUBSTRATE MEASUREMENT APPARATUS WITH ELECTRON DISTORTION UNIT

TECHNICAL FIELD

The present invention disclosed herein relates to a measurement apparatus, and in more detail, to a measurement apparatus including an atomic force microscope capable of measuring a surface of a substrate on an atomic scale and an electron microscope capable of observing the surface of the substrate and the atomic force microscope on an electronic scale.

BACKGROUND

An atomic force microscope (AFM) may measure atomic scales by scanning a surface of a substrate using a probe. The probe may scan the surface of the substrate by using a contact method, a non-contact method, or an intermittent contact method. The AFM may provide an image of a change in position of the probe ascending and descending. Additionally, the AFM may be applied to measure a friction force, a magnetic property, an electric property, an electrochemical property, and electric capacity of the surface of the substrate. Generally, the probe of the ATM may be easily worn or damaged. Interaction between the surface of the substrate and the AFM may be observed by using an electron microscope. A state of the probe of the AFM may be in-situ monitored by using the electron microscope.

DISCLOSURE OF THE INVENTION

Technical Problem

The present invention provides an atomic force microscope (AFM) whose cantilever together with a substrate therebelow may be monitored by using an electron microscope. The present invention also provides a measurement apparatus capable of accurately observing interaction between a cross section of a substrate and a probe of an AFM.

Technical Solution

According to an embodiment of the inventive concept, there is provided a measurement apparatus including an atomic force microscope (AFM) including a probe scanning a surface of a substrate and a cantilever, an electron microscope including a body tube emitting an electron beam to the AFM and the substrate and an electron detector detecting secondary electrons generated from the substrate due to the electron beam, and at least one distortion unit distorting a path of the secondary electrons emitted from the substrate to be forwarded to the electron detector while the AFM and the substrate are being monitored by using the electron microscope. In this case, the electron microscope may obtain a distinct image of the probe and a cross section of the substrate by vertically emitting the electron beam to the probe of the AFM and the cross section of the substrate. Accordingly, the electron microscope may allow an observer to accurately observe interaction between the cross section of the substrate and the probe.

The distortion unit may include an electrode distorting the path of the secondary electrons by using an electric field.

The electrode may include an anode charged by a positive charge attracting the secondary electrons by gravitation.

The electrode may be formed on an opposite side of the electron gun body tube facing the electron detector.

The electrode may be formed on a surface of a terminal of the body tube of the electron microscope. When the path of the secondary electrons is distorted by using the electrode, the path of the incident electron beam having high energy of 1 to 30 kV may be bent due to the electrode.

The distortion unit may further include a plurality of permanent magnets distorting the path of the secondary electrons by using a magnetic field. In this case, since the plurality of permanent magnets induces the magnetic field to compensate an effect of the electric field induced by the electrode, the path of the electron beam having the high energy may be maintained. In this case, the secondary electrons having low energy of 50 eV or less may hardly receive the effect of the magnetic field.

The plurality of permanent magnets may be disposed on a front and a rear of a plane formed by the electron detector, the body tube, and facing different poles of the plural permanent magnets in opposition.

According to another embodiment of the inventive concept, there is provided a measurement apparatus including an AFM including a scanner transferring a substrate, a probe scanning a surface of the substrate transferred by the scanner, and a cantilever fastening the probe and an electron microscope including a body tube vertically emitting an electron beam to a plane formed by a cross section of the substrate and the probe of the AFM and an electron detector detecting secondary electrons generated from the substrate due to the electron beam emitted by the body tube.

The measurement apparatus may include at least one distortion unit distorting a path of the secondary electrons emitted from the substrate to be forwarded to the electron detector while the AFM and the substrate are being monitored by using the electron microscope.

The distortion unit may include an electrode distorting the path of the secondary electrons by using an electric field.

The distortion unit may further include a plurality of permanent magnets distorting the path of the secondary electrons by using a magnetic field.

As described above, according to the embodiments, a surface of a substrate below a cantilever may be measured by using a distortion unit distorting a path of secondary elections emitted from the substrate hidden by the cantilever to be forwarded to an electron detector of an electron microscope.

Also, since distinct images of a cross section of the substrate and a probe of an atomic force microscope (AFM) may be obtained by allowing electron beams to be vertically incident thereinto, interaction between the cross section of the substrate and the probe may be accurately observed.

DETAILED DESCRIPTION

Figure 1:
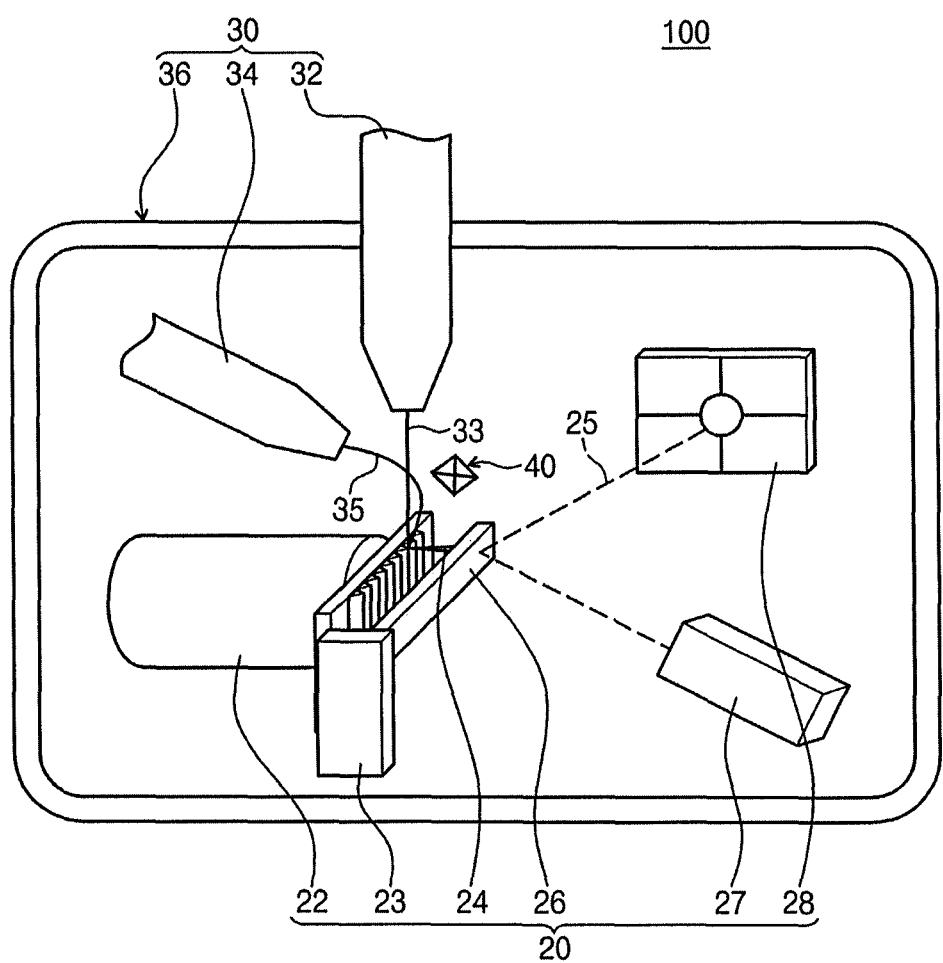
FIG. 1 is a schematic view illustrating a measurement apparatus according to an embodiment of the inventive concept.

A measurement apparatus includes an atomic force microscope (AFM) including a probe for scanning a surface of a substrate and a cantilever, an electron microscope including a body tube emitting electron beams to the AFM and the substrate and an electron detector detecting secondary electrons generated by the substrate, and at least one distortion unit distorting a path of the secondary electrons emitted from the substrate to be forwarded to the electron detector while monitoring the AFM and the substrate by using the electron microscope. In this case, the electron microscope vertically emits the electron beams to the probe of the AFM and a cross section of the substrate, thereby obtaining distinct images of the probe and the cross section of the substrate. Accordingly, the electron microscope may allow an observer to accurately observe interaction between the cross section of the substrate and the probe.

Hereinafter, exemplary embodiments of the present invention will be described in detail with reference to the attached drawings. Advantages and features of the present invention and a method of achieving the same will be specified with reference to the embodiments that will be described in detail with reference to the attached drawings. However, the present invention is not limited to the embodiments described below and may be embodied in different forms. The embodiments that will be described hereafter are provided to allow the disclosure to be thoroughgoing and perfect and to allow a person skilled in the art to fully understand the scope of the present invention. The present invention is defined only by the scope of following claims. Through the entire specification, like reference numerals designate like elements.

Terms used in the specification are to describe the embodiments but not to limit the scope of the present invention. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. Also, as just exemplary embodiments, reference numerals shown according to an order of description are not limited to the order.

Figure 2:
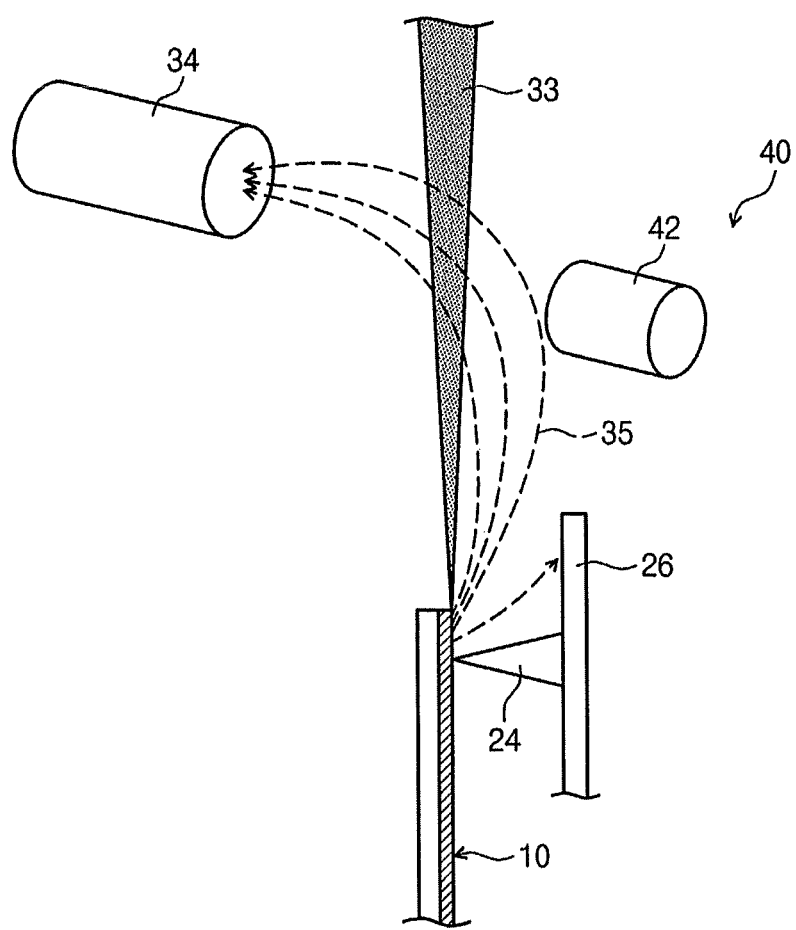
FIGS. 2 and 3 are views illustrating a distortion unit of FIG. 1.
Figure 3:
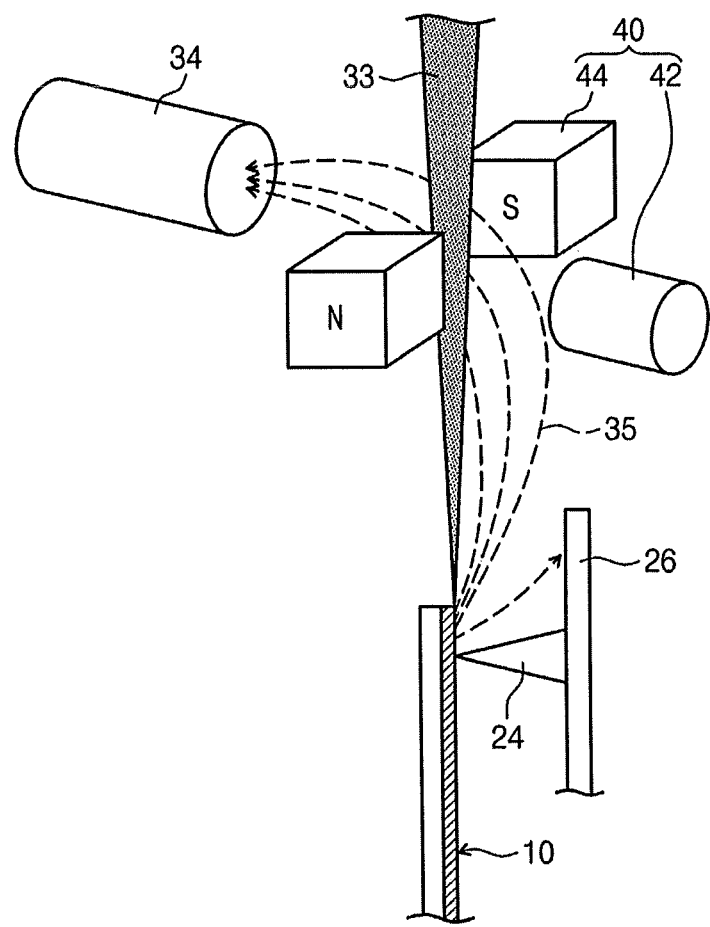

FIG. 1 is a schematic view illustrating a measurement apparatus 100 according to an embodiment of the inventive concept, and FIGS. 2 and 3 are views illustrating a distortion unit 40 of FIG. 1.

As shown in FIGS. 1 to 3, the measurement apparatus 100 may include at least one distortion unit 40 distorting a path of secondary electrons 35 emitted from a substrate 10 hidden by a bottom or a periphery of a cantilever 26 of an atomic force microscope (AFM) 20 to be forwarded toward an electron detector 34 of an electron microscope 30 when to monitor a measurement state of the AFM 20 by using the electron microscope 30.

In this case, the distortion unit 40 may change a progress direction, that is, the path of the secondary electrons 35 generated from the substrate 10. The distortion unit 40 may include at least one of an electrode 42 and a plurality of permanent magnets 44. The electrode 42 may change the path of the secondary electrons 35 into an electric field. On the other hand, the permanent magnet 44 may change the path of the secondary electrons 35 into a magnetic field. The secondary electrons 35 may be detected by the electron detector 34 of the electron microscope 30 without being blocked or seized by the cantilever 26 due to the electric field or the magnetic field.

Accordingly, the measurement apparatus 100 may monitor a surface of the substrate 10 below the cantilever 26 of the AFM 20 by using the electron microscope 30.

The AFM 20 may measure a condition of the surface of the substrate 10 on an atomic scale. The AFM 20 may measure the surface of the substrate 10 supported by a scanner 22 by using a probe 24 formed on the cantilever 26. The scanner 22 may precisely transfer the substrate 10 located below the probe 24. Also, the scanner 22 may precisely transfer the probe 24 above the substrate 10. For example, the scanner 22 may include piezoelectric ceramics transferred along an X-axis or a Y-axis or oscillating according to electric signals. The scanner 22 may operate in a way of linear scanning, that is, raster. The scanner 22 passes a first line while scanning the same, returns to an original location, moves vertically by one column, and passes second, third, and nth lines repetitively, thereby entirely scanning a desired two-dimensional area.

The cantilever 26 is connected to a cantilever driving unit 23. The cantilever 26 may be bent according to ascending or descending of the probe 24 to scan according to the scanner 22. The cantilever 26 may have an elastic coefficient lower than a coupling elastic coefficient between atoms of the substrate 10, for example, 10 N/m. The cantilever 26 to which a contact type probe 24 of is connected may have an elastic coefficient smaller than the cantilever 26 to which a non-contact type probe 24 is connected. Also, the cantilever 26 to which the non-contact type probe 24 is connected may oscillate with a resonant frequency from about several tens kHz to about several hundreds kHz. Accordingly, the cantilever 26 to which the non-contact type probe 24 is connected may have higher horizontal resolution and stability as the elastic coefficient becomes greater. For example, the cantilever 26 may be formed as a triangular shape to be horizontal to the substrate 10. The cantilever 26 may be formed as one of a single crystal silicon film and a silicon nitride film.

The probe 24 may be formed to protrude and to be sharpened at a terminal of the cantilever 26. For example, the probe 24 may be manufactured by micro-machining and may be connected to the cantilever 26. The probe 24 may scan while being in contact or not in contact with the surface of the substrate 10 transferred by the scanner 22. The substrate 24 may be formed as one of a pyramidal shape, a tetrahedral shape, and a conical shape. The contact type probe 24 may have a tip rounder than that of the non-contact type probe 24.

The electron microscope 20 may detect a change of a location of the probe 24 ascending and descending by using an optical method. The AFM 20 may include a laser unit 27 emitting a laser beam 25 to the cantilever 26 on the probe 24 and a light sensor 28 detecting the laser beam 25 reflected from the cantilever 26.

Figure 4:
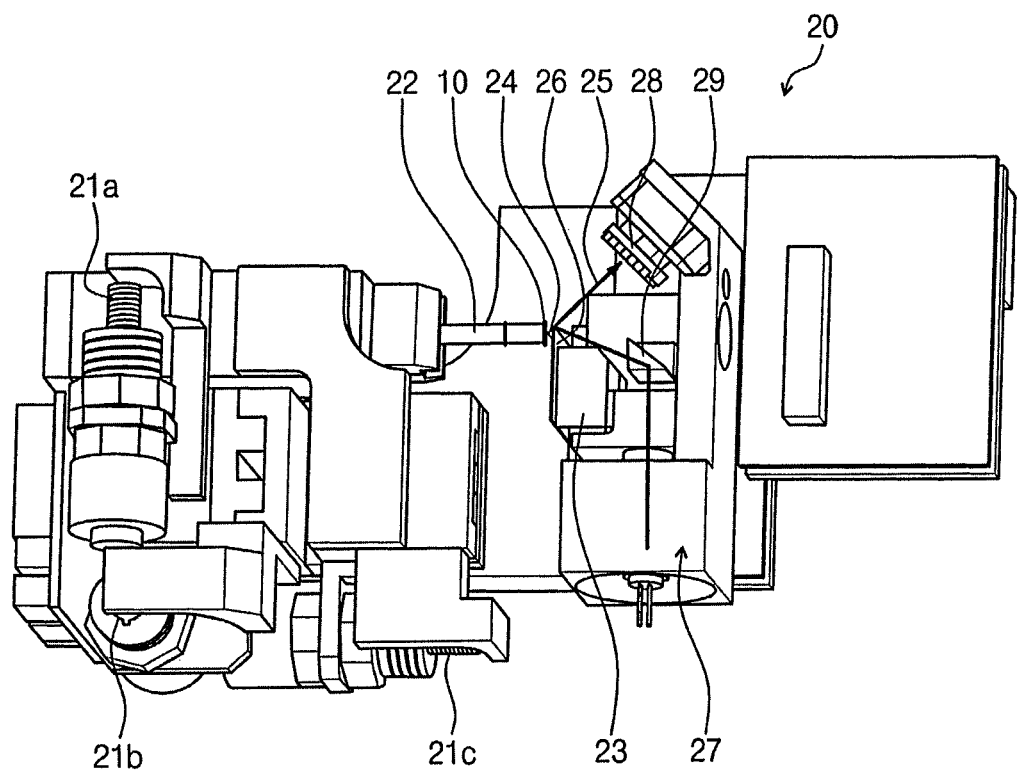
FIG. 4 is a perspective view illustrating an atomic force microscope (AFM) of FIG. 1.

For example, the laser beam 25 may be shown as an arrow as shown in FIG. 4 illustrating the AFM 20. FIG. 4 is a perspective view illustrating the AFM 20 of FIG. 1 in more detail. The laser beam 25 generated by the laser unit 27 may pass a reflector 29 and may be incident into the cantilever 26 and then may be reflected toward the light sensor 28 The cantilever 26 may be connected to a driving unit in a direction in which the laser beam 25 is reflected toward the light sensor 28. The reflector 29 may change a path of the laser beam 25 from the laser unit 27 to the cantilever 26. The scanner 22 may transfer a location of the substrate by using an X-axis driving unit 21a, a Y-axis driving unit 21b, and a Z-axis driving unit 21c. The substrate 10 may be fastened to a terminal of the scanner 22 and may be scanned through a transfer of the scanner 22. Accordingly, the AFM 20 may continuously detect changes of the location of the probe 24 ascending and descending, corresponding to changes of an angle of reflection of the laser beam 25.

The AFM 20 may be monitored together with the substrate 10 by the electron microscope 30. The electron microscope 30 may detect and image the secondary electrons 35 generated by injecting an electron beam 33 in a two-dimensional direction. The electron microscope 30 may monitor the substrate 10 and the probe 24 and the cantilever 26 of the AFM 20 in a chamber 36 pumped to a vacuum degree more than a certain value to prevent scattering of the electron beam 33 and the secondary electrons 35. For example, the chamber 36 may be pumped to a low vacuum or a high vacuum of about 10-3 torr. The electron microscope 30 may include an electron gun body tube 32 emitting the electron beam 33 to the substrate 10 and the probe 24 and the cantilever 26 of the AFM 20 and the electron detector 34 for detecting the secondary electrons 35 generated from the substrate 10, the probe 24, and the cantilever 26. Accordingly, the electron microscope 30 may obtain images corresponding to the substrate 10, the probe 24, and the cantilever 26 by using detection signals of the secondary electrons 35.

The electron gun body tube 32 may focus the electron beam 33 from the outside onto the substrate 10 and the probe 24 and the cantilever 26 of the AFM 20 to scan. The electron gun body tube 32 may include a source generating the electron beam 33 and at least one condenser lens for focusing the electron beam 33. Also, the electron gun body tube 32 adjusts a speed of the electron beam 33 by using an attenuator, thereby adjusting magnification. A depth of focus of the electron beam 33 may be determined by a final aperture of the electron gun body tube 32. When a radius of the final aperture becomes smaller, the depth of focus may increase.

The electron detector 34 may detect the secondary electrons 35 generated from the substrate 10, the probe 24, and the cantilever 26 exposed toward the electron beam 33. The electron detector 34 may include a first anode charged to be a positive charge attracting the secondary electrons 35 by gravitation. The secondary electrons 35 may be emitted from a surface of a material exposed toward the electron beam 33. Accordingly, the secondary electrons 35 are surface-emission electrons whose real shape may not be recognized. However, as shown in FIGS. 1 and 2, the secondary electrons 35 may be detected by the electron detector 34 as an electron flux or as a secondary electron beam.

The secondary electrons 35 may include backscattered electrons. The electron detector 34 may include an SE electron detector, a backscattered electron detector, or a negative emission electron detector. The electron detector 34 may be disposed on the periphery of the electron gun body tube 32 to detect the secondary electrons 35. The electron detector 34 may detect the secondary electrons 35 while moving along the electron beam 33 of the electron gun body tube 32. The electron detector 34 may continuously detect the secondary electrons 35 and may convert the same into electric signals while moving together with the electron gun body tube 32. Accordingly, the electron microscope 30 may output a moving picture by using a display device.

The electron microscope 30 may monitor the surface of the substrate 10 and the probe 24 and the cantilever 26 of the AFM 20 in real time. For example, the electron microscope 30 may measure not only a condition of the surface of the substrate 10 but also a damage or destruction of the probe 24 of the AFM 20 in real time. The electron microscope 30 may monitor the surface of the substrate 10 measured by the probe 24 and the cantilever 26 of the AFM 20 in real time. Images obtained by the electron microscope 30 and the AFM 20, respectively, may be compared with each other.

Also, the electron microscope 30 may monitor the surface of the substrate 10 by detecting the secondary electrons 35 generated from the surface of the substrate 10 hidden by the bottom of the cantilever 26. The secondary electrons 35 have a negative charge. The number or energy of the secondary electrons 35 may be detected by the electron detector 34 to be different according to a kind and a shape of the surface of the substrate 10. The path of the secondary electrons 35 hidden by the cantilever 26 of the AFM 20 may be distorted by the electrode 42 to be detected by the electron detector 34.

The distortion unit 40 may prevent the secondary electrons 35 generated from the surface of the substrate 10 from being blocked or seized by the cantilever 26. The electrode 42 of the distortion unit 40 may be disposed between a part emitting the secondary electrons 35 and the electron detector 34. The electrode 42 may be a second anode attracting the secondary electrons 35 by gravitation. The secondary electrons 35 may return in a direction of being emitted from the electron gun body tube 32. However, the electron beam 33 and the secondary electrons 35 have the same negative charge. The electron beam 33 and the secondary electrons 35 may be forwarded respectively with a certain angle. The electrode 42 may distort the secondary electrons 35 to reduce the angle between the electron beam 33 and the secondary electrons 35. A voltage applied to the second anode may be smaller than a voltage applied to the first anode.

Accordingly, for example, the electrode 42 may be disposed on an opposite side of the electron gun body tube 32 facing the electron detector 34. When the electron gun body tube 32 and the electron detector 34 are close to each other, the electrode 42 may be formed on a surface of a terminal of the electron gun body tube 32. The electrode 42 may be disposed to be close to the aperture of the electron gun body tube 32. Although the electron detector 34 for detecting the secondary electrons 35 and the electrode 42 are shown in FIG. 2, the electron gun body tube 32 may be disposed in a location opposite to the electrode 42 facing the electron detector 34.

The plurality of permanent magnets 44 may be disposed on both front and rear sides of a plane formed by the electron detector 34, the electron gun body tube 32, and the electrode 42. Different polarities of permanent magnets 44 are facing etch other. The plurality of permanent magnets 44 may include a dipole inducing a magnetic field in a direction vertical to the path of the secondary electrons 35. The magnetic field induced by the plurality of permanent magnets 44 may change the path of the secondary electrons 35 by a Lorentz force. For example, the plurality of permanent magnets 44 may be disposed to induce the magnetic field from the front to the rear of the plane of the path of the secondary electrons 35. The permanent magnets 44 having a north polar may be disposed on the front of the plane of the path of the secondary electrons 35, and the permanent magnets 44 having a south polar may be disposed on the rear thereof.

Accordingly, since the secondary electrons 35 generated from the substrate 10 hidden by the cantilever are distorted by an electric field or a magnetic field to be forwarded toward the electron detector 34, the apparatus 100 may monitor the substrate 10 hidden below the cantilever 26.

Figure 5:
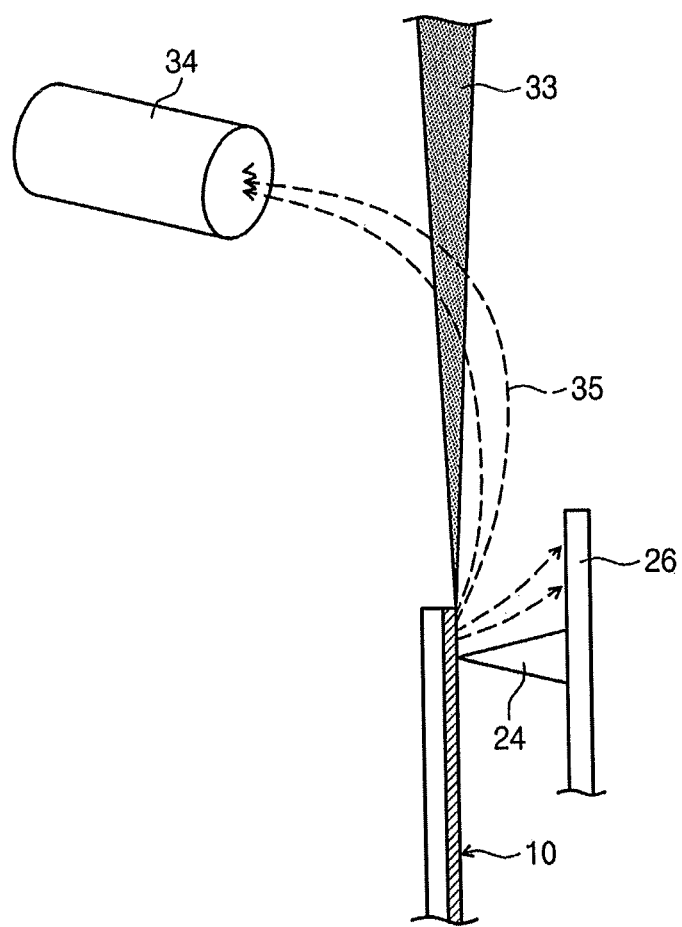
FIG. 5 is a schematic view illustrating the measurement apparatus from which an electrode shown in FIG. 2 is removed.

FIG. 5 is a schematic view illustrating the measurement apparatus 100 from which the electrode 42 is removed. The secondary electrons 35 generated from the substrate 10 below the cantilever 26 may be blocked or seized by the cantilever 26 on the periphery of the probe 24. In this case, the cantilever 26 may hide the surface of the substrate 10 therebelow while the probe 24 is scanning the surface of the substrate 10. Accordingly, a shadow 50 may be shown on the substrate 10 below the cantilever 26 as shown in FIG. 6.

Figure 6:
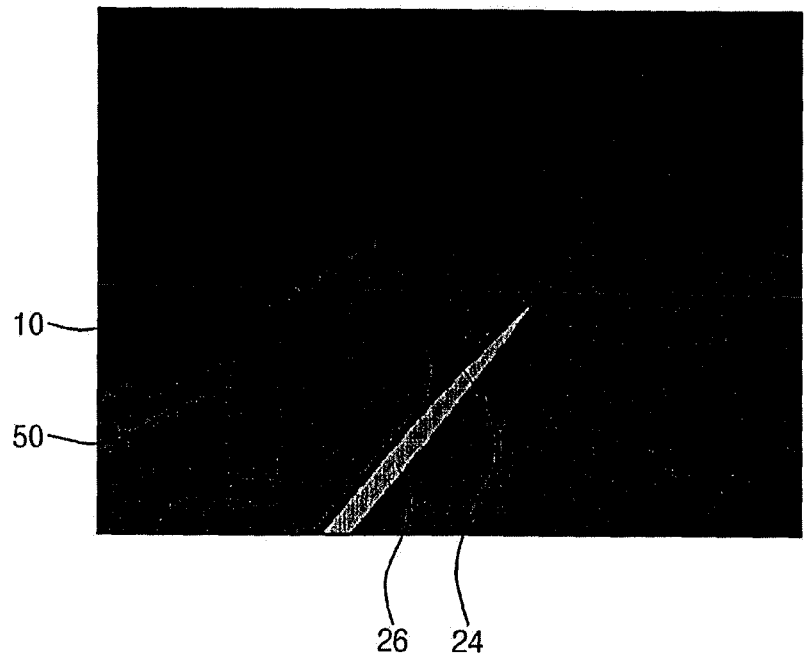
FIG. 6 is a photo of an electron microscope, illustrating a substrate hidden by a cantilever.

FIG. 6 is a photo of the electron microscope 30, illustrating the substrate 10 hidden by the cantilever 26. When the electrode 42 is not used, since some of the secondary electrons 35 are not detected from the substrate 10 below the cantilever 26, the shadow 50 is shown. In this case, the shadow 50 may be shown because the number of the secondary electrons 35 detected from the substrate 10 below the cantilever 26 decreases. The shadow 50 may be removed by the electrode 42 distorting the secondary electrons 35 emitted from the substrate 10 below the cantilever 26.

Accordingly, the measurement apparatus 100 may measure the surface of the substrate 10 hidden by the cantilever 26 by using the electrode 42 distorting the path of the secondary electrons 35.

On the other hand, the electron microscope 30 may more accurately show the states of the substrate 10 and the probe 24 when the substrate 10 and the probe 24 are separated from the electron gun body tube 32 with the same distance. That is, the electron microscope 30 may obtain an image illustrating the interaction between the substrate 10 and the probe when a plane formed by the substrate 10 and the probe 24 is vertical to the electron beam 33. Accordingly, the electron microscope 30 may obtain a distinct image when the substrate 10 and the probe 24 are separated from the electron gun body tube 32 with the same distance. For example, the electron microscope 30 allows the electron beam 33 to be vertically incident into a plane formed by a cross section 14 of the substrate 10, the probe 24, and the cantilever 26, thereby showing states of the probe 24 and the cross section 14 of the substrate 10 as an image. The cross section 14 of the substrate 10 may include a side of the substrate 10 whose horizontal plane or level surface is made to stand or split.

Figure 7:
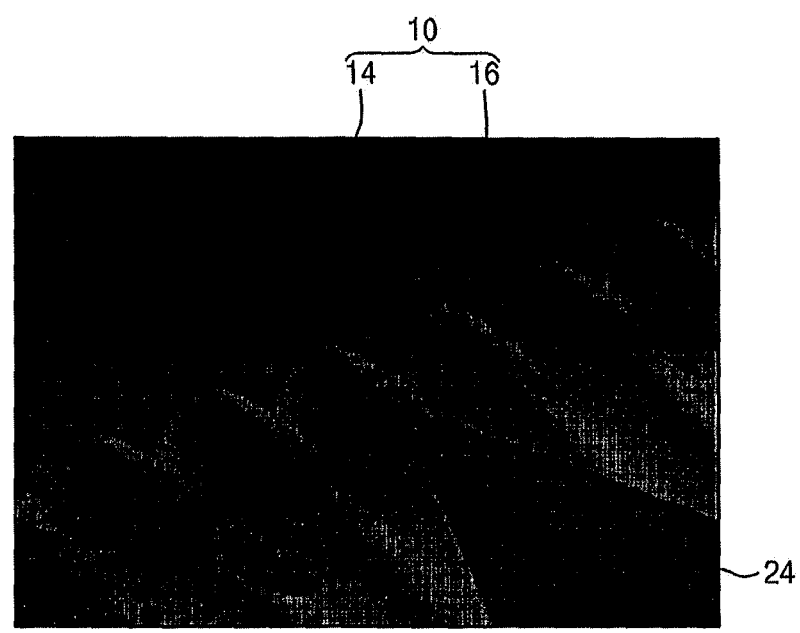
FIG. 7 is a photo of the electron microscope, illustrating a state in which a cross section of the substrate and a probe are not vertical to an electronic beam.

FIG. 7 is a photo of the electron microscope 30, illustrating a state in which the cross section 14 of the substrate 10 and the probe 24 are not vertical to the electron beam 33. When the cross section 14, for example, the side of the substrate 10 and the probe 24 are not on the same plane, that is, when the cross section 14 of the substrate 10 and the probe 24 have different focal depths from each other, the electron microscope 30 may not provide a distinct image of all the substrate 10 and the probe 24 in one scene. For example, the electron microscope 30 allows the electron beam 33 to be slantly incident into the cross section 14 and the level surface, for example, a top surface of the substrate 10, thereby obtaining an image in which a boundary line between the cross section 16 and the level surface 16 of the substrate 10 having focal depths different from the probe 24 distinctly shown. Accordingly, when the substrate 10 and the probe 24 are separated from the electron gun body tube 32 of the electron microscope 30 with the same distance and are not vertical to the electron beam 33, interaction between the AFM 20 and the substrate 10 may be difficult to be monitored by the measurement apparatus 100.

Figure 8A:
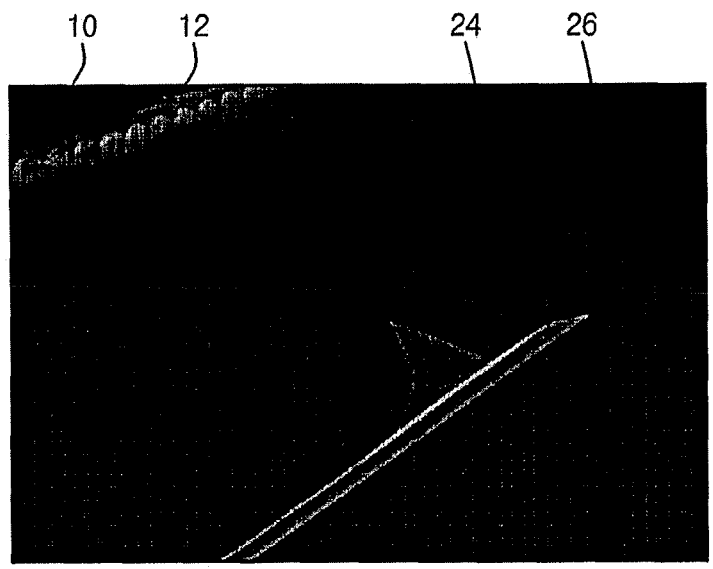
FIGS. 8A and 8B are photos of the electron microscope, illustrating a state in which the cross section of the substrate and the probe are vertical to electronic beams.
Figure 8B:
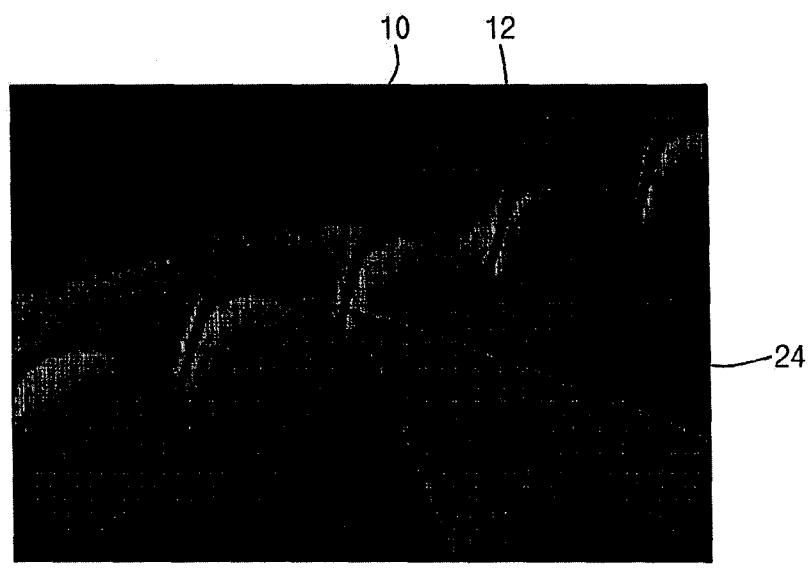

FIGS. 8A and 8B are photos of the electron microscope 30, illustrating a state in which the cross section 14 of the substrate 10 and the probe 24 are vertical to the electron beam 33. When the cross section 14 of the substrate 10 and the probe 24 are on the same plane and the plane is vertical to the electron beam 33, the measurement apparatus 100 may obtain an image distinctly showing all the cross section 14 of the substrate 10 and the probe 24. In this case, the photos of the electron microscope 30 show a state in which the substrate 10 and the probe 24 are separated from each other and a state in which the substrate 10 and the probe 24 are in contact with each other. The probe 24 connected to the cantilever 26 may be close to the surface of the substrate 10. The probe 24 may scan along a pattern 12 formed on the substrate 10. The tip of the probe 24 may be transferred along the pattern 12 of the substrate 10.

The tip of the probe 24 may not scan all the surface of the substrate 10. For example, when an inclination angle of the probe 24 moving along the surface of the substrate 10 is smaller than an inclination angle of the pattern 12, a side of the probe 24 may scan a top of the pattern 12.

FIGS. 9A to 9F are views sequentially illustrating a state in which a measurement defect of the AFM 20 is monitored by using the electron microscope 30 in the measurement apparatus 100.

Figure 9A:
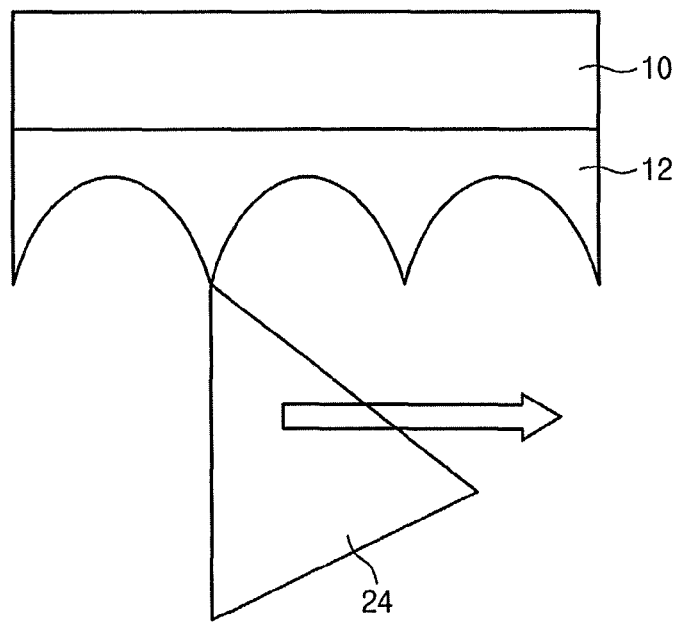
FIGS. 9A to 9F are views sequentially illustrating a state in which a measurement defect of the AFM is monitored by using the electron microscope in the measurement apparatus.
Figure 9B:
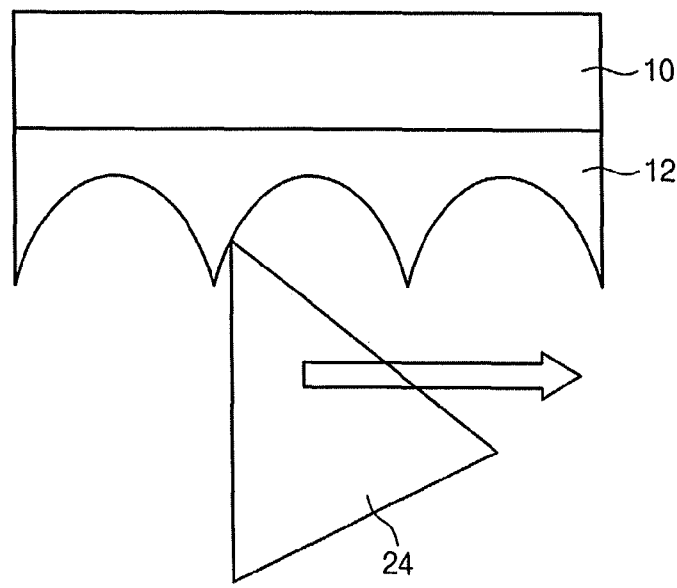
Figure 9C:
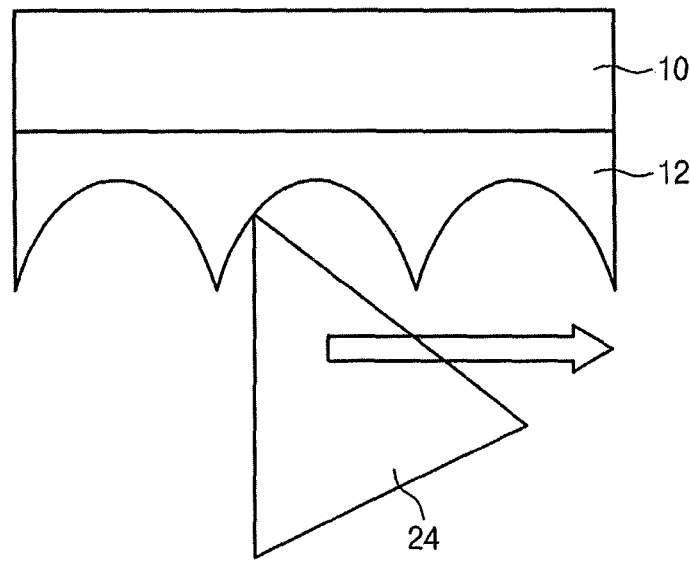
Figure 9D:
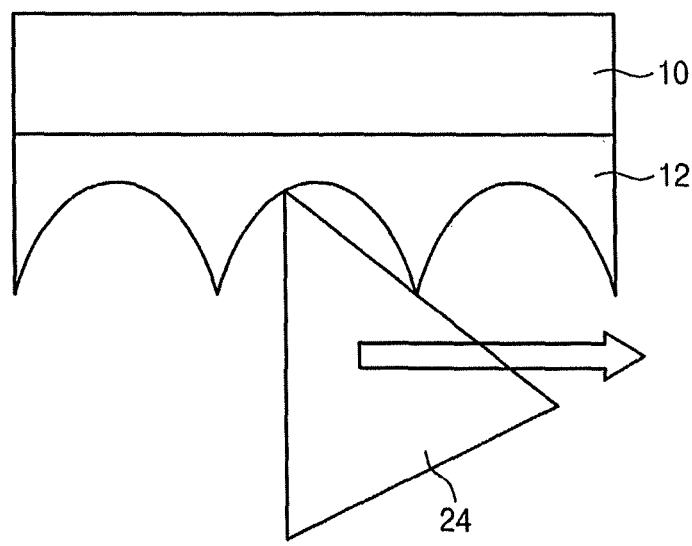
Figure 9:
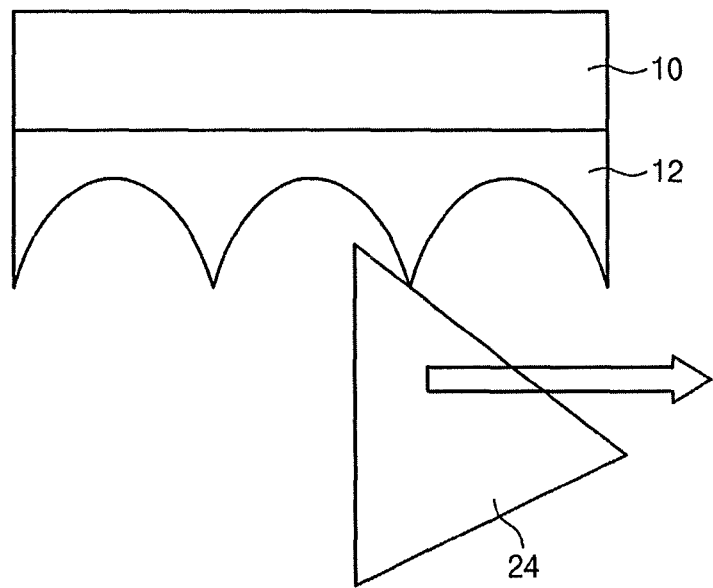
Figure 9:
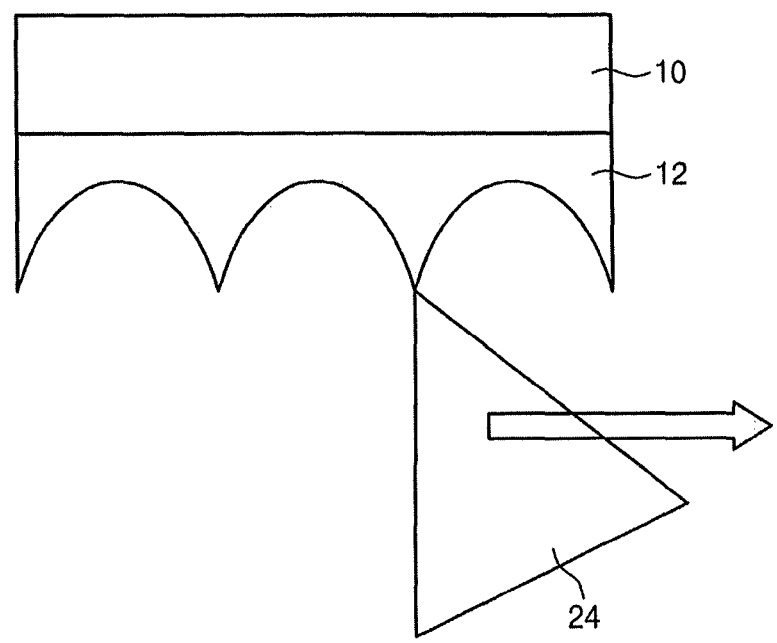

Referring to FIGS. 9A to 9F, the measurement apparatus 100 may obtain an image by using the electron microscope 30, the image in which the side of the probe 24 scans the top of the pattern 12 formed on the substrate 10. Also, the electron microscope 30 may show inclined planes of the probe 24 and the pattern 12 as an image. When the inclined plane of the probe 24 is smaller than the inclined plane of the pattern 12, the side of the probe 24 may scan the top of the pattern. As shown in FIGS. 9C, 9D, and 9E, in the case of the AFM 20, when the side of the probe 24 scans the top of the pattern 12, a measurement defect may occur. Accordingly, the measurement apparatus 100 may monitor the measurement defect of the AFM 20 by using the electron microscope 30.

Figure 10:
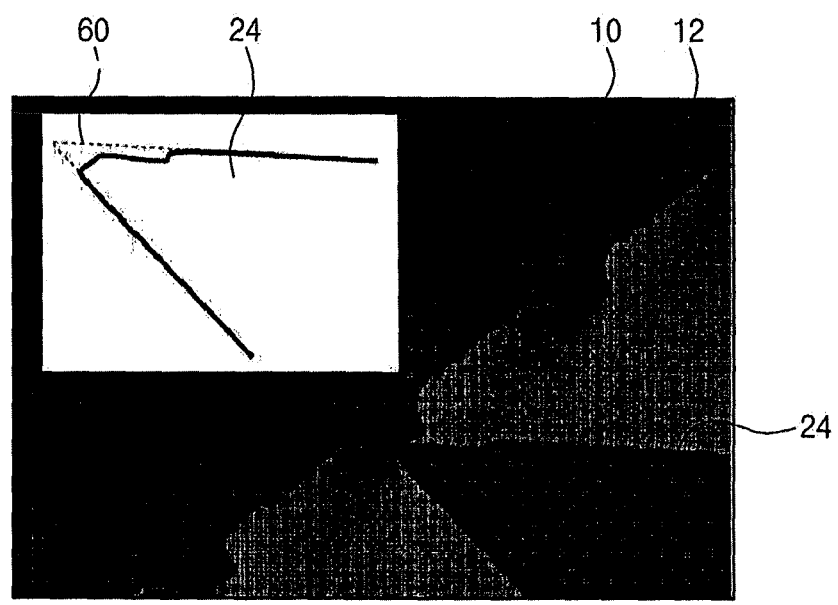
FIG. 10 is a photo of the electron microscope, illustrating a state in which a surface of the substrate is scanned while a tip of the probe is being damaged.

FIG. 10 is a photo of the electron microscope 30, illustrating a state in which the surface of the substrate 10 is scanned while a tip 60 of the probe 24 is being damaged. The measurement apparatus 100 may monitor a damage of tip 60 of the probe 24 of the AFM 20 by using the electron microscope 30 in real time. In this case, in the case of the AFM 24, when scanning in a direction in the tip of the probe 24 is damaged, the measurement defect such as a double dip may occur.

Figure 11:
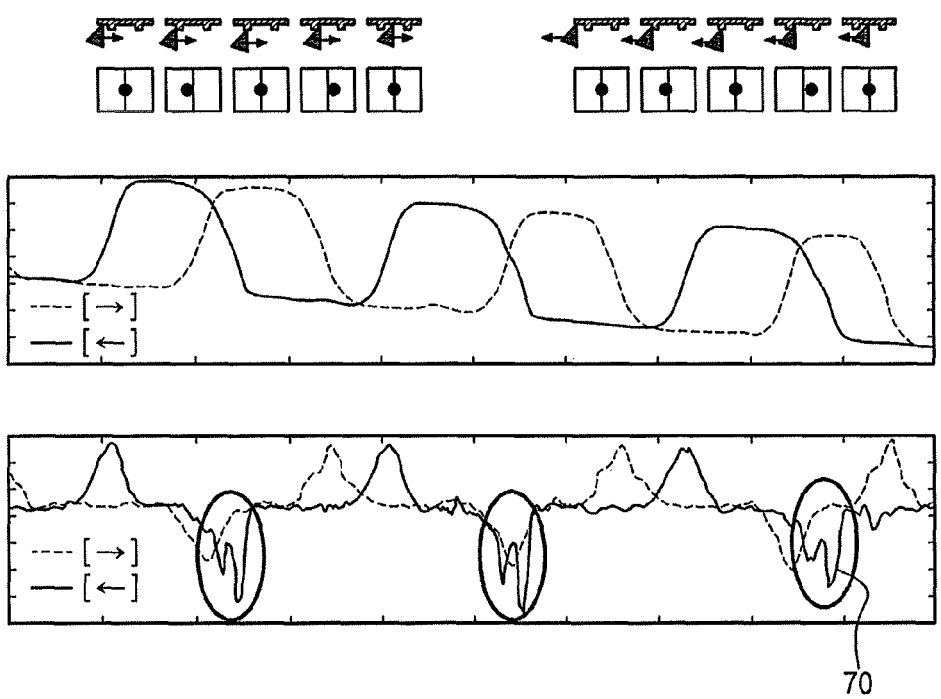
FIG. 11 illustrates double dips shown in a direction in which the tip of the probe is damaged in a lateral force microscope.

FIG. 11 is a view illustrating double dips 70 shown in the direction in which the tip 60 of the probe 24 is damaged in a lateral force microscope. When the AFM 20 scans the pattern 12 of the surface of the substrate 10 by using the probe 24 with the damaged tip 60, the double dips 70 may be shown. The double dips 70 may indicate that a damaged part of the probe 24 is separated from the surface for a short time while making an ascent of the inclined plane of the pattern 12. Accordingly, the electron microscope 30 may allow an observer to recognize a state of the damage of the probe 24 of the AFM 20 and a shape of the measurement defect caused thereby.

Accordingly, since the measurement apparatus 100 may monitor a measurement state of the AFM 20 by using the electron microscope 30, measurement reliability may be increased.

While one or more embodiments of the present invention have been described with reference to the figures, it will be understood by those of ordinary skill in the art that various changes in form and details may be made therein without departing from the spirit and scope of the present invention as defined by the following claims. Therefore, it will be understood that the embodiments described above are just exemplary but not limitative in all aspects.

What is claimed:

1. A measurement apparatus comprising:
   an atomic force microscope (AFM) comprising a probe scanning a surface of a substrate and a cantilever;
   an electron microscope comprising a body tube emitting an electron beam to the AFM and the substrate and an electron detector detecting secondary electrons generated from the substrate due to the electron beam; and
   at least one deflector to change a path of the secondary electrons emitted from the substrate toward the electron detector while the AFM and the substrate are being monitored by using the electron microscope.

2. The measurement apparatus of claim 1, wherein the deflector includes comprises an electrode distorting the path of the secondary electrons by using an electric field.

3. The measurement apparatus of claim 2, wherein the electrode comprises an anode charged by a positive charge attracting the secondary electrons by gravitation.

4. The measurement apparatus of claim 3, wherein the electrode is formed on an opposite side of the body tube facing the electron detector.

5. The measurement apparatus of claim 4, wherein the electrode is formed on a surface of a terminal of the body tube of the electron microscope.

6. The measurement apparatus of claim 2, wherein the deflector includes a plurality of permanent magnets distorting the path of the secondary electrons by using a magnetic field.

7. The measurement apparatus of claim 6, wherein the plurality of permanent magnets are disposed on a front and a rear of a plane formed by the electron detector, the body tube, and the electrode and facing by different polarities each other.

8. A measurement apparatus comprising:
   an atomic force microscope (AFM) comprising a scanner transferring a substrate, a probe scanning a surface of the substrate transferred by the scanner, and a cantilever fastening the probe;
   an electron microscope comprising a body tube vertically emitting an electron beam to a plane formed by a cross section of the substrate and the probe of the AFM and an electron detector detecting secondary electrons generated from the substrate due to the electron beam emitted by the body tube; and
   at least one deflector to change a path of the secondary electrons emitted from the substrate toward to the electron detector while the AFM and the substrate are being monitored by using the electron microscope.

9. The measurement apparatus of claim 8, wherein the at least one deflector includes an electrode distorting the path of the secondary electrons by using an electric field.

10. The measurement apparatus of claim 9, wherein the at least one deflector includes a plurality of permanent magnets distorting the path of the secondary electrons by using a magnetic field.

* * * * *